United States Patent [19]

Arai et al.

[11] Patent Number: 4,915,550

[45] Date of Patent: Apr. 10, 1990

[54] PRESSURE FOOT OF PRINTED CIRCUIT BOARD DRILLING APPARATUS

[75] Inventors: Kunio Arai, Atsugi; Yasuhiko Kanaya, Machida, both of Japan

[73] Assignee: Hitachi Seiko Ltd., Tokyo, Japan

[21] Appl. No.: 288,153

[22] Filed: Dec. 22, 1988

[51] Int. Cl.⁴ ............... B23B 47/34; B23Q 11/02; B23Q 11/10

[52] U.S. Cl. .................... 408/56; 408/61; 408/67; 408/95; 409/136; 409/137

[58] Field of Search .......... 408/56, 61, 67, 95, 408/97, 98, 704; 409/137, 135, 136; 144/252 R

[56] References Cited

U.S. PATENT DOCUMENTS

| | | | |
|---|---|---|---|
| 4,011,792 | 3/1977 | Davis | 408/61 X |
| 4,037,982 | 7/1977 | Clement | 408/67 X |
| 4,340,326 | 7/1982 | Buonauro et al. | 408/16 |

FOREIGN PATENT DOCUMENTS

| | | | |
|---|---|---|---|
| 2948475 | 6/1981 | Fed. Rep. of Germany | 408/61 |
| 16910 | 1/1988 | Japan | 408/56 |
| 1329716 | 9/1973 | United Kingdom | 144/252 R |

*Primary Examiner*—Steven C. Bishop
*Attorney, Agent, or Firm*—Antonelli, Terry & Wands

[57] ABSTRACT

In a pressure foot used in an apparatus for drilling printed circuit boards, which includes a bearing for holding a spindle, and formed at the end portion thereof with an inner void space having a bottom hole for passing the drill bit, the end portion of the pressure foot is provided with an annular end surface possibly contacting with the printed circuit board and air injection ports for injecting compressed air into the inner space. The air injection ports are so directed that the air flow from each injection port is tangently contacts with the circumferential surface of the drill.

11 Claims, 6 Drawing Sheets

RELATIONSHIP BETWEEN FLOW RATE OF AIR SUPPIY AND TEMPRATURE OF COOLING AIR

PRESSURE FOOT OF PRINTED CIRCUIT BOARD DRILLING APPARATUS

BACKGROUND OF THE INVENTION

The present invention relates to a pressure foot used in a printed circuit board drilling apparatus for drilling a printed circuit board with a drill.

A printed circuit board is processed through several steps, i.e. usually drilling, through-hole copper plating, patterning, etching and stripping, printing for solder resist, gold plating on contact fingers, solder coating press for blanking and finishing, electrical inspection, final inspection, flux coating, shipment, and mounting. The drilling step is the first step for processing a printed circuit board.

Therefore, the drilling process requires a high precision and a high quality.

In a drilling process of a printed circuit board, for preventing any protrusion from being formed at hole ends of the printed circuit board, an upper or entry board and a lower or back-up board are stacked on the upper and the lower surfaces of the printed circuit board, respectively, and a pressure foot is arranged for pressing these boards at regions near the hole.

For example, when a lower board of 0.063 inch thick, three printed circuit boards of each 0.063 inch thick and an upper board of 0.04 inch thick are stacked one upon another and clamped together, and then drilled in a direction from the upper board toward the lower board until the lower board is drilled by depth of 0.04 inch, the depth of the drilled hole in the stacked boards becomes 0.269 inch.

When the diameter of the hole to be drilled is, for example, 0.047 inch, the aspect ratio (ratio of hole depth $L_h$ to hole diameter D) becomes 5.7.

In such a case where the diameter of the hole to be drilled is rather large, and the aspect ratio is rather small (below 6–8), the printed circuit boards can be drilled by moving a drill from a drilling starting point A to a drilling end point B with a single drill feed rate (FIG. 1).

On the other hand, when the diameter of a hole is, for example, 0.031 inch, the aspect ratio reaches 8.7.

In such a case where the diameter of the hole to be drilled is small and the aspect ratio is greater, it becomes difficult to carry out the drilling from the drilling starting point A to the drilling end point B in a single motion in the manner as described above.

Namely, in the case of a greater aspect ratio, chips generated in a drilling process become difficult to be taken out and the drill flute is clogged with these chips, thereby causing the following problems:

1. Smoothness of the inner wall of the drilled hole is deteriorated;
2. Drill bit wear increases, because a large quantity of heat is generated by the friction between the drill and the hole wall and the temperature of the drill is substantially raised;
3. Base material (such as epoxy resins) of the printed circuit board is molten due to the raised temperature of the drill, and the molten material is adhered to the copper layer exposed to the inner surface of the hole, and when cooled, there appear smears; and
4. Thrust load of the drill increases, making the drill easy to break.

At the present time, electronic packaging density of the printed circuit board has been increasing. Therefore, conductor line width on the printed circuit board is required to be finer than 0.04 inch, and consequently, the hole diameter of the printed circuit board is required to be smaller than, for example, 0.016 inch. Thus, the aspect ratio of the hole has become large and it becomes difficult to drill in a single stroke drilling.

An arrangement of the drilling apperatus for a printed circuit board described above is shown in FIG. 2 as an example.

In FIG. 2, there are shown a bed 1 of a drilling apparatus for a printed circuit board, and a table 2 which is mounted on the bed 1 movable along a direction indicated by an arrow X and moved on the table 2 by a driving means not shown. Further, drills 3 are removably held by holders 4 secured to the table 2. A column 5 is secured to the bed 1 and has a shape striding over the table 2. A carriage 6 is supported by the column 5 movably in an arrowed direction Y and moved along the column 5 by a motor 7. A saddle 8 is mounted on the carriage 6 movably in an arrowed direction Z and moved along the carriage 6 by a motor 9. Spindles 10 are rotatably supported by the saddles 8 and rotated by a motor 11. Each of the spindles has a chuck at an end portion thereof which grasps and takes out one of the drills for drilling operation.

Each of printed circuit boards W is provided with an upper board and a lower board piled on and integrally secured to each side of the base circuit board, respectively, and together fixed to the table 2 by means of reference pins P.

In the arrangement mentioned above, by moving the table 2 in the direction X and the carriage 6 in the direction Y, the position of the drill 3 held by the spindle 10 is determined relative to the printed circuit board W, and then the spindle 10 is moved in the direction Z for drilling the printed circuit board.

The spindle 10 of the printed board drilling apparatus mentioned above is structurally shown in FIG. 3.

In FIG. 3, a cylinder 12 is secured to the saddle 8, and is formed with a cavity 13 of a greater diameter and a flange 14 inwardly projecting at an end thereof. Compressed air is supplied to the cavity 13 through a pipe 15. A bearing 16 rotatably supports the spindle 10 in the central portion of the bearing, and is supported by the cylinder 12 in a fit condition. A chuck 17 is supported by the spindle at an end thereof in a manner such that the chuck can be opened and closed. A piston 18 is formed with a flange 20, which movably fits the a space 19 defined by the cavity of the cylinder 12 and the bearing 16. A pressure foot 21 is secured to an end of the piston 18. The pressure foot 21 is provided at the side surface thereof with an exhaust port 22 which is to be connected with a vacuum room of a dust collector for exhausting chips produced in the drilling process, and at the bottom surface thereof with grooves 23 for sucking air in the drilling process.

In the arrangement above, the piston 18 is moved to the lower end of the cylinder 12 by supplying air of a predetermined pressure through the pipe 15 to the space 19, and the room in the pressure foot 21 is evacuated, through the vacuum port 22.

FIG. 4 shows an air flow pattern in the pressure foot according to the arrangement above. By virtue of such an air flow, the drill 3 can be cooled and the chips adhered to the drill 3 can be removed.

It is disclosed, for example, in U.S. Pat. No. 4,340,326 to use a pressure foot for pressing printed circuit boards and drilling the same.

When a pressure foot is used for pressing, it is required to clamp the printed circuit boards at a region near the hole to be drilled for preventing the upper board and the printed circuit boards from rising up.

For this purpose, the end portion of the pressure foot has an inner diameter of about 0.4 inch, and formed with radial grooves on the end surface thereof.

Accordingly, the size of the grooves is so limited as not to satisfy a requirement for the size. On the other hand, the pressure foot is connected with a chip collector, and the air in the pressure foot is evacuated by means of vacuum throughout a drilling process. Because the chip collector has a rather large vacuum capacity and the grooves on the end surface of the pressure foot have a rather small size, the pressure in the pressure foot is always relative to the ambient atmosphere throughout the drilling process.

SUMMARY OF THE INVENTION

An object of the present invention is to provide a pressure foot of a drilling apparatus for a printed circuit board, which can effect an efficient drilling of a hole having a greater aspect ratio.

Another object of the present invention is to provide a pressure foot which can effect a precise location of a hole position, a precise shape of the hole and a high quality of drilling process.

For achieving these objects, according to the present invention, at an end portion of the pressure foot there are formed passages for passing compressed air and grooves opening inwardly, and compressed air is directed into the inside of the pressure foot through these passages and grooves.

DETAILED DESCRIPTION OF THE PREFERRED EMBODIMENTS

Figure 1:
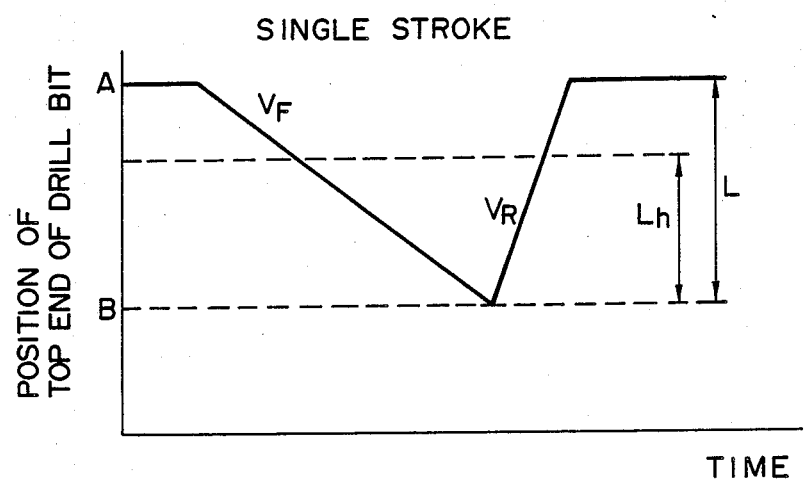
FIG. 1 shows a relationship between the top end of a drill bit and drilling time, of a prior art device.
Figure 2:
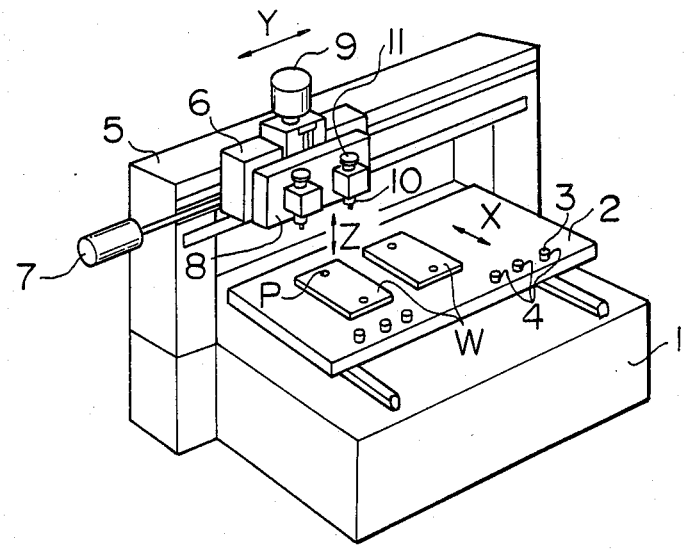
FIG. 2 is a perspective view of a drilling machine to which the present invention is to be applied.
Figure 3:
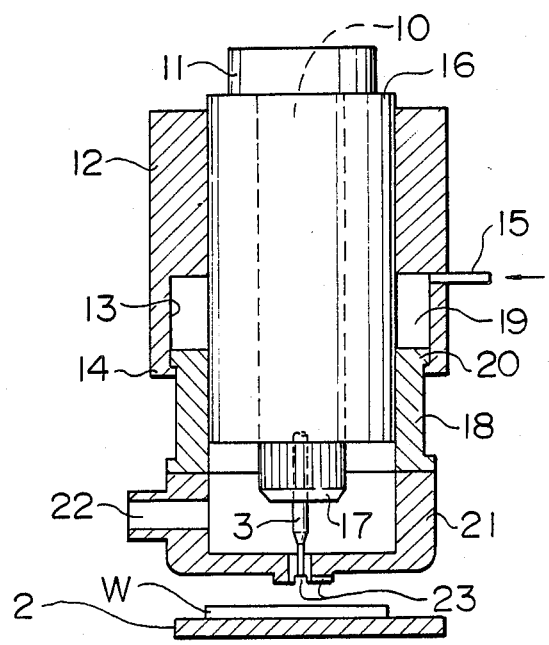
FIG. 3 is a longitudinal sectional view showing the drill and the pressure foot shown in FIG. 2.
Figure 4:
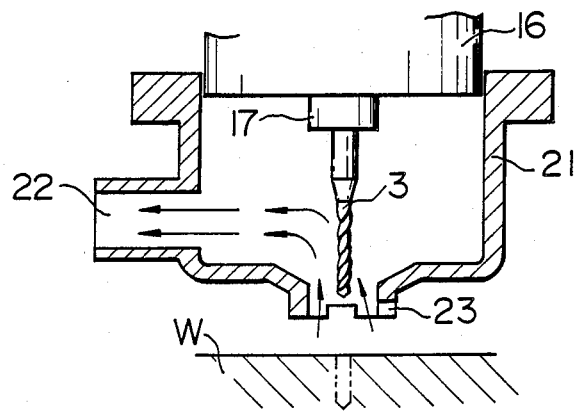
FIG. 4 shows a state of air flow of the prior art pressure foot to be raised from a workpiece.
Figure 5:
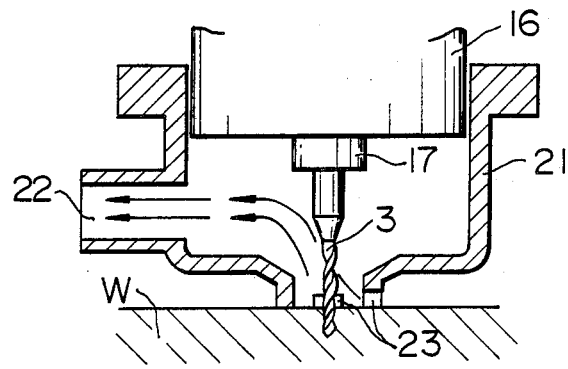
FIG. 5 shows a state of air flow of the pressure foot during drilling.

FIGS. 6-9 relate to the present invention. In these figures, a bearing 16 rotatably supports therein a spindle 10. The spindle 10 supports a chuck 17 in a manner such that the chuck can be opened or closed. The chuck holds a drill 3.

A pressure foot 21 fits the bearing 16, and is slidable in an axial direction of the bearing. In the side wall of the pressure foot 21 there is provided a vacuum port 22 for vacuum chips produced in a drilling process. The exhaust port 22 is connected with a hose 23, which is connected with a chip collector.

On an end surface 21a of the pressure foot 21 there is formed an annular groove 24 and grooves or passages 25 extending from the annular groove 24 to the inner surface of the pressure foot 21. The groove 24 is connected with a compressed air source through a pipe 26.

On a printed circuit board W, there are stacked an upper board and a lower board, and secured together to a table of the drilling apparatus.

In this arrangement, compressed air is supplied from the compressed air source 27 through the pipe 26 to the groove 24, and the inside space of the pressure foot is scavenged by the air exhausted through the outlet port 22. The air source 27 is adapted such that the pressure and/or flow rate of the compressed air from the air source 27 can be controlled manually or automatically. The air introduced over the end surface 21a of the pressure foot 21 is directed as shown with arrows in FIG. 6, and exhausted through the exhaust port 22, thereby cooling the drill 3.

Then, when the bearing is lowered and the end surface 21a of the pressure foot 21 contacts with the upper surface of printed circuit board W, the compressed air supplied to the groove 24 through the pipe 26 is directed through the grooves 25 into the inside of the pressure foot 21.

At this time, since the pressure in the pressure foot 21 is maintained negative by a sucking action of the dust collector, the air introduced through the grooves 25 into the inside of the pressure foot 21 expands abruptly in the pressure foot. Further, because the room inside of the pressure foot 21 is isolated from outside of the pressure foot by the pressure foot body and the printed circuit board W, the expansion of the air mentioned above is an adiabatic one and the air temperature is considerably lowered.

In such a way, the drill can be cooled by the air of lowered temperature. The upper board is cooled together with the drill by the cold air at the region surrounded by the pressure foot.

When the bearing 16 is moved downwardly, a drilling process of the drill 3 into the upper board starts.

When the drill cuts into the upper board, the drill is deprived of its heat by the cold upper board and further cooled.

Accordingly, if the upper board is made of material having a good heat conduction, such as aluminum, the cooling effect can be further enhanced.

Figure 7:
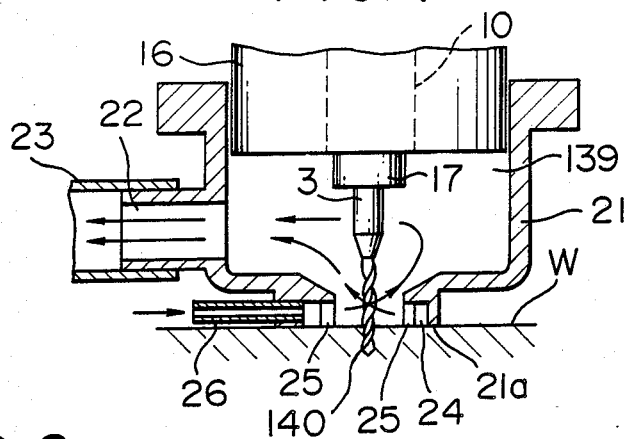
FIG. 7 shows the same as shown in FIG. 6, during drilling.
Figure 8:
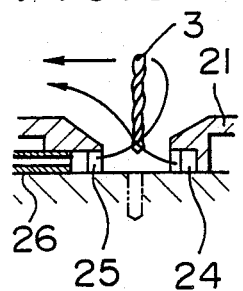
FIG. 8 shows a state on the way of a raising or lowering process of the pressure foot.
Figure 6:
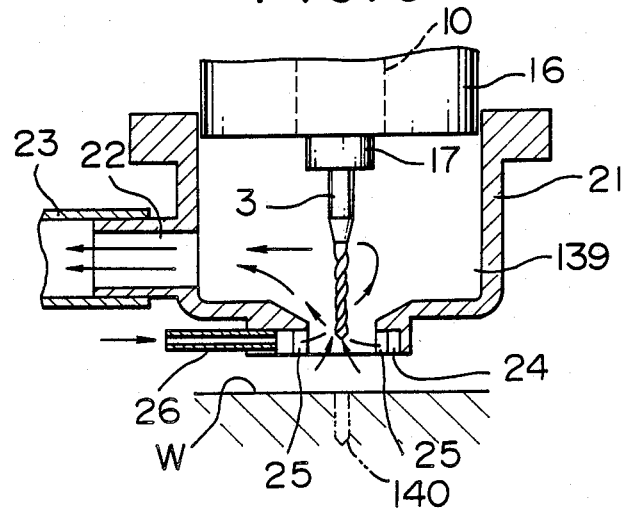
FIG. 6 shows a pressure foot of the present invention and air flow of the pressure foot to be raised from a workpiece.
Figure 9:
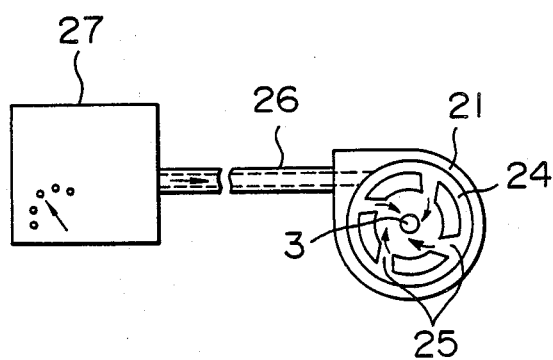
FIG. 9 is a bottom view of the pressure foot.
Figure 10:
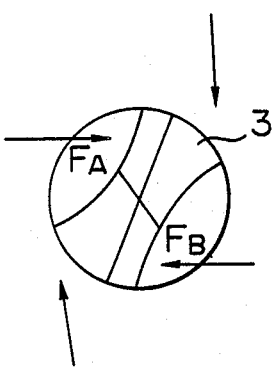
FIG. 10 is a bottom view showing air flow around the drill.

Then, the bearing is further moved, and, as shown in FIG. 7, the drill 3 drills a hole in the printed circuit board W. When the tip of the drill reaches the fabrication end point, the bearing 16 changes its moving direction and returns to the fabrication starting point.

In the operation above, after the drill 3 is pulled out of the printed circuit board W and before the pressure foot 21 starts parting from the printed circuit board W, the tip of the drill 3, the temperature of which has been raised by frictional heat in a drilling process, is cooled by the cold air in the pressure foot. After the pressure foot 21 has parted from the printed board W, the tip of the drill is cooled by the air introduced over the end surface 21a of the pressure foot.

By cooling the drill in the above manner, the resin melted by the frictional heat in a drill process and adhered to the drill 3 is cooled into a solid state, thereby effecting an easy separation of the resin from the drill. The resin together with the chips are thrown off from the drill by centrifugal force, and then exhausted through the outlet port 22 to the dust collector while floating in the air through the pressure foot 21.

By directing the outlet portion of each groove 25 along a tangential line to the drill, the compressed air introduced into the inside of the pressure foot 21 is spirally directed around the drill, thereby improving the cooling effect. Further, since the compressed air spirally flows along the grooves of the drill, the air is more effective for removing the chips or resins.

Figure 11:
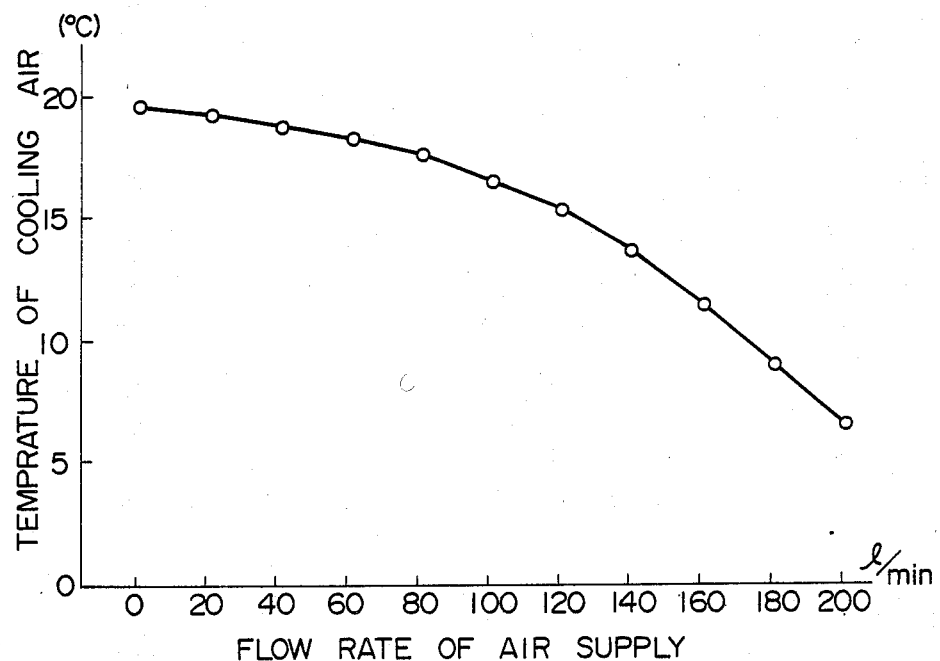
FIG. 11 shows air temperature change in the pressure foot in relation to air flow rate.

FIG. 11 shows a relation between the cooling air temperature and the air supply rate, where the experimental conditions are as follows:

| | |
|---|---|
| Inner volume of the pressure foot | 80 cm$^3$ |
| Pressure in the pressure foot in a dust collecting operation | 1400 mm/Ag |
| Temperature of air to be supplied to the air compressor (room temperature) | 19.5° C. |
| Pressure of the compressed air | 6 kg/cm$^2$-G |
| Flow rate of the compressed air | 0–200 l/min. |

As seen in the shown relation, when the compressed air is supplied at a flow rate of 200 l/min., the temperature in the pressure foot 21 is lowered by 13° C., thereby cooling not only the inner surface of the pressure foot, but also the upper board at a region surrounded by the pressure foot.

Thus, the drill contents with the cold air and the cold upper board, and the cooling efficiency of the drill can be improved.

Figure 12B:
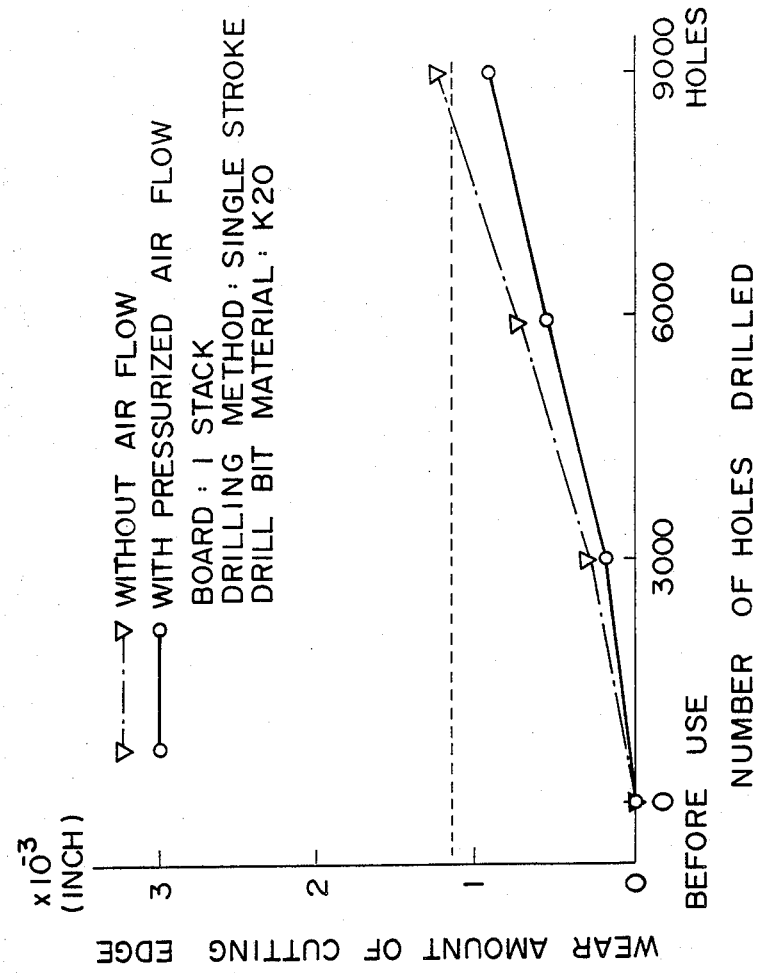
FIG. 12B shows a relation between wear amount of the cutting edge and number of holes drilled.
Figure 12A:
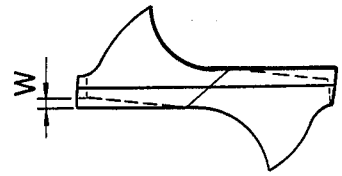
FIG. 12A is a plan view of the drill tip.

FIG. 12b shows relations between the wear amount of cutting edge of the drill and the number of hole drilled.

As seen in the figure, when nine thousand holes have been drilled, wear amount of the drill tip is less by 27% in the apparatus having a pressure foot according to the present invention than in that of a prior art device.

Further, according to the present invention, since the drilling process includes a single stroke, the drilling efficiency is improved.

What is claimed is:

1. A pressure foot used in a printed circuit board drilling apparatus, said pressure foot being supported by a bearing holding a spindle in such a manner as to be slidable in the axial direction of the bearing, being connected with a dust collector through a vacuum port, and being adapted to press a printed circuit board in a drilling process and to exhaust the chips coming out in the drilling process through the vacuum port towards the dust collector, comprising:

an annular end surface adapted to contact with the printed circuit board in such a manner that an interior volume of the pressure foot is isolated from the exterior of the pressure foot when the pressure foot and the printed circuit board are brought into contact with each other during the drilling process, a plurality of injection ports inwardly opened to the inner surface of the pressure foot, and compressed air feed passage means having one end thereof connected with said plurality of injection ports and at another end with a compressed air supply source, wherein said plurality of injection ports are arranged to provide rotational air flow therefrom, in a region surrounded by an inner surface of the pressure foot, to the vacuum port in such a manner that the direction of the rotational air flow is opposite to the rotational direction of the drill.

2. A pressure foot according to claim 1, wherein said compressed air feed passage means are grooves formed at the central portion of said end surface of the pressure foot situated below the vacuum port such that the rotational air flow is substantially directed along a flute of the drill in a helical manner.

3. A pressure foot according to claim 1, wherein said compressed air feed passage means is an annular groove formed at the central portion of said end surface of the pressure foot situated below the vacuum port such that the rotational air flow is substantially directed along a flute of the drill in a helical manner.

4. A pressure foot according to claim 2, wherein said plurality of injection ports are grooves connected with said grooves formed on the end surface and with the inside of the pressure foot.

5. A pressure foot according to claim 3, wherein said plurality of injection ports are grooves connected with said annular groove formed on end surface and with the inside of the pressure foot.

6. A pressure foot according to claim 5, wherein each of said plurality of injection ports is directed along a line tangent to the drill side surface.

7. A pressure foot according to claim 6, wherein each of said plurality of injection ports is directed along a line which tangentially contacts with the drill side surface with a contact line parallel to a flute of the drill near the contact point.

8. A pressure foot according to claim 1, wherein said compressed air feed passage means are grooves formed above the said end surface of the pressure foot situated below the vacuum port such that the rotational air flow is substantially directed along a flute of the drill in a helical manner.

9. A pressure foot according to claim 8, wherein each of said plurality of injection ports is directed tangentially to the side surface of a hole to be drilled.

10. A pressure foot according to claim 8, wherein each of said plurality of injection ports is directed along a line which tangentially contacts with the side surface of a hole to be drilled with a contact line parallel to a flute of the drill near the contact point.

11. A printed circuit board drilling machine, comprising a bearing rotatably supporting a bearing therein, a spindle supporting a chuck which can be opened and closed to hold a drill, and a pressure foot supported by the bearing and defining an interior volume and has an annular portion for contacting a printed circuit board such that the drill can pass therethrough to drill the board, wherein a plurality of injection ports open into the interior volume of the pressure foot to inject compressed gas at a tangent to a side surface of the drill and in a direction opposite to the rotational direction of the drill, with adiabatic expansion of the gas to cool the drill during a drilling process, and means is provided for exhausting chips produced during the drilling process.

* * * * *